United States Patent [19]

Moulin

[11] 4,453,795
[45] Jun. 12, 1984

[54] CABLE-TO-CABLE/COMPONENT ELECTRICAL PRESSURE WAFER CONNECTOR ASSEMBLY

[75] Inventor: Norbert L. Moulin, Placentia, Calif.

[73] Assignee: Hughes Aircraft Company, El Segundo, Calif.

[21] Appl. No.: 520,791

[22] Filed: Jul. 7, 1981

Related U.S. Application Data

[63] Continuation of Ser. No. 636,504, Dec. 1, 1975, abandoned.

[51] Int. Cl.³ .................... H01R 13/621; H05K 1/09
[52] U.S. Cl. ............................. 339/92 M; 339/17 F; 339/176 MF
[58] Field of Search .................. 174/68.5; 339/17 F, 339/92 R, 92 M, 94 M, 176 MF

[56] References Cited

U.S. PATENT DOCUMENTS

| | | | |
|---|---|---|---|
| 2,752,580 | 6/1956 | Shewmaker | 339/92 R |
| 3,177,103 | 4/1965 | Tally et al. | 174/68.5 X |
| 3,466,206 | 4/1969 | Beck | 156/3 |
| 3,701,964 | 10/1972 | Cronin | 339/94 M X |
| 3,740,698 | 6/1973 | Jerominek | 339/17 F |
| 3,937,857 | 2/1976 | Brummett et al. | 156/3 X |
| 4,012,093 | 3/1977 | Crane | 339/94 M X |

Primary Examiner—Eugene F. Desmond
Attorney, Agent, or Firm—Lewis B. Sternfels; W. J. Bethurum; A. W. Karambelas

[57] ABSTRACT

Flexible or conventional wire cables are terminated and interconnected at connectors with only a pressure type contact. Two cable terminations are fabricated from identically chemically milled thin metallic wafers, in which one wafer is plated with metallic buttons. The two wafers are placed opposing each other and pressed between pressure plates with contact made only by the buttons. A compression pad of silicone rubber is placed between the plates so as to prevent deformation beyond the elastic limit of the buttons by plastic flow and to evenly distribute forces between contacting wafers whose surfaces may be irregular.

19 Claims, 9 Drawing Figures

CABLE-TO-CABLE/COMPONENT ELECTRICAL PRESSURE WAFER CONNECTOR ASSEMBLY

This is a continuation, of application Ser. No. 636,504 filed Dec. 1, 1975, now abandoned.

CROSS-REFERENCE TO RELATED APPLICATION

The present invention is an improvement over copending patent application Ser. No. 636,514, entitled "Electrical Connector Assembly Utilizing Wafers For Connecting Electrical Cables" by Patrick A. Reardon II, filed herewith.

BACKGROUND OF THE INVENTION

1. Field of the Invention

The present invention relates to means for interconnecting electrical cables or electrical cables and components together without use of conventional, frictionally engaging electrical connectors.

2. Description of the Prior Art

Conventional electrical cables are required to be compatible with standard connectors, such as pin and socket, blade and tuning fork, and other friction type contact interfaces. While such connectors function well, they are generally bulky. In some cases, such bulk is unacceptable with flat cables. As is well known in the art, one advantage of flat cable is its thinness and ability to wind in and about electronic components and equipment. The use of conventional connectors may defeat the use of such flat cables. Friction also shortens the life of such connectors when repeated mating or unmating occurs.

These problems have been essentially overcome in the above-identified copending patent application Ser. No. 636,515 entitled "Electrical Connector Assembly Utilizing Wafers For Connecting Electrical Cables" by Patrick A. Reardon II. While this invention has been shown to work, its usefulness may be limited under certain conditions. It has been found that, if the metallic buttons were deformed beyond their plastic memory by application of too great a pressure thereon, the connectors would not be reusable after the initial connection. Furthermore, if the two wafers were not completely flat one with respect to the other, slight variations might arise so as to preclude at least a firm contact between each and every pair of contact pads. Furthermore, if the buttons were not exactly all of the same height, uneven forces could be exerted thereon, thereby also leading to deformation of at least some buttons beyond their plastic memory, or lack of contact between some buttons.

SUMMARY OF THE INVENTION

The present invention incorporates all of the advantages of copending application Ser. No. 636,514 avoiding the several disadvantages thereof. Briefly, the present invention comprises terminations of at least two cables or one cable to one component which have identical configurations. Metallic buttons are formed on the contact pads of one termination so that, when the terminations are placed opposing each other and pressed between two pressure plates or surfaces, connections are made between the respective contact pads of the terminations by means of the buttons. Further placed between the pressure surfaces is a compression pad of elastomeric material which may be confined or unconfined, as desired. If not confined, the compression pad acts as both the means for evenly distributing the pressures between the terminations and to afford a gas-tight contact therebetween without deforming the buttons beyond their elastic limit. When confined, a spring relief is additionally included to control the force of pressure so as to permit a larger pressure to be exerted between the pads, for example, when a large number of contacts or buttons are utilized.

It is, therefore, an object of the present invention to provide for an improved pressure type contact assembly.

Another object of the present invention is to provide for a minimum of bulk in connecting cables together or to components.

Another object of the present invention is to provide for a low cost electrical connector.

Another object of the present invention is to provide for a means for batch fabrication of the connectors.

Another object is to provide for a connector capable of being fabricated by conventional printed circuit processing.

Another object is to provide for even distribution of pressures between contacting electrical terminations.

Another object is to provide for mating connection even when a pair of wafers or terminations do not have mating flat or curved surfaces.

Other aims and objects as well as a more complete understanding of the present invention will appear from the following explanation of exemplary embodiments and the accompanying drawings thereof.

DESCRIPTION OF THE PREFERRED EMBODIMENTS

Figure 1:
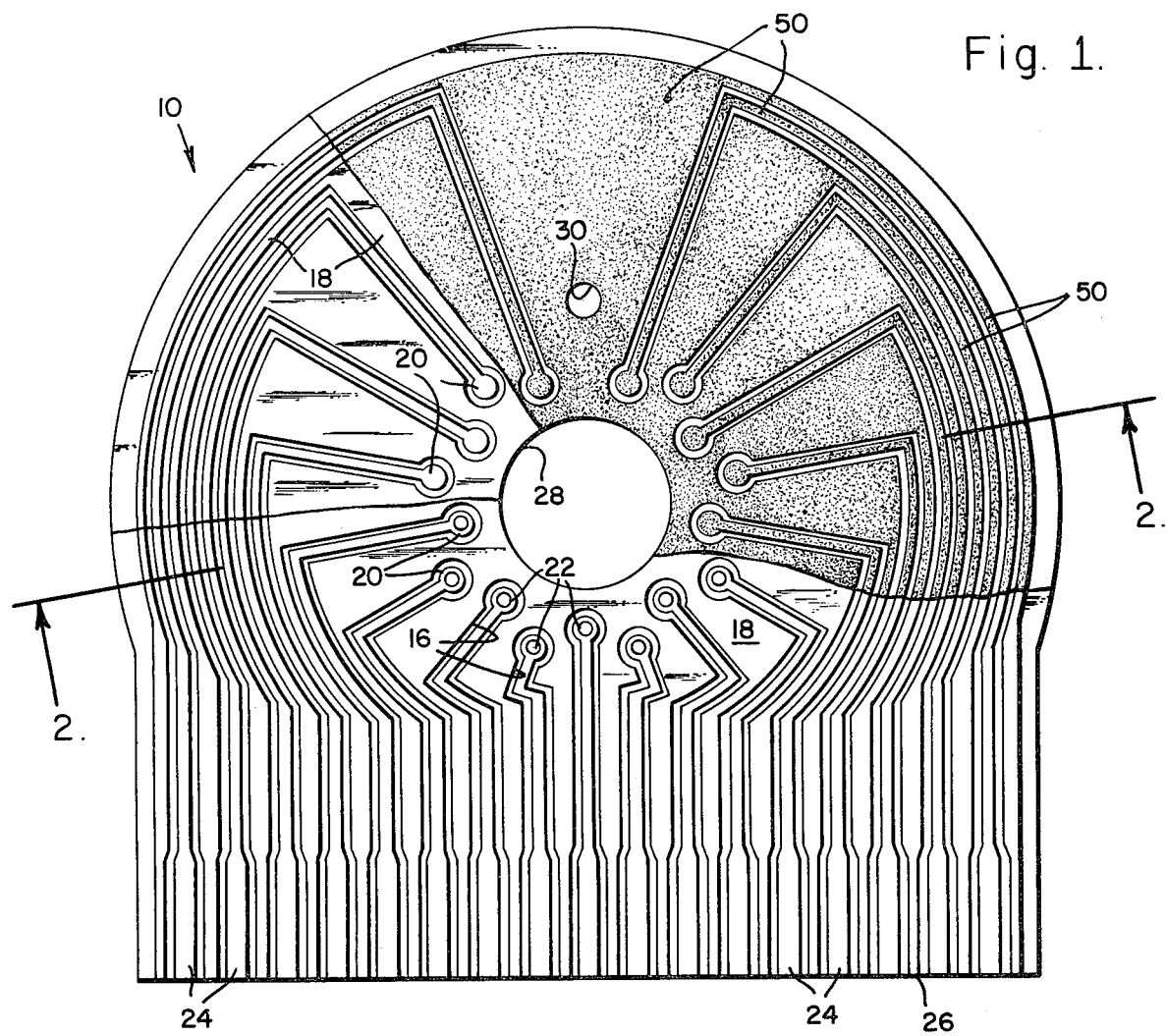
FIG. 1 is a plan view of a wafer of the present invention shown in various stages of fabrication.
Figure 2:
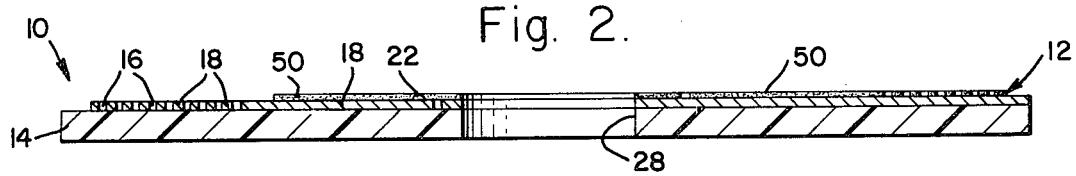
FIG. 2 is a cross-sectional view of the wafer of FIG. 1 taken along lines 2—2 thereof.

A wafer 10 comprises a layer or sheet of electrically conductive material 12, such as of 7 mil thick beryllium copper, adhered to a dielectric material 14, such as of polyimide. Sheet 12 has material removed therefrom to form grooves 16, such as by chemical etching or milling. Accordingly, sheet 12 comprises a plurality of conductor paths 18 terminating in contact pads 20 and, additionally, on one wafer, are placed metallic buttons 22. The other ends 24 of conductive paths 18 extend to a common edge 26 for attachment to a flexible cable or conventional wire cable, such as by surface lap soldering. Preferably, a central hole 28 and an alignment hole 30 are placed through each wafer so as not only to obtain connection between a pair of wafers but also to align the respective contact pads on each of the two wafers.

Figure 3:
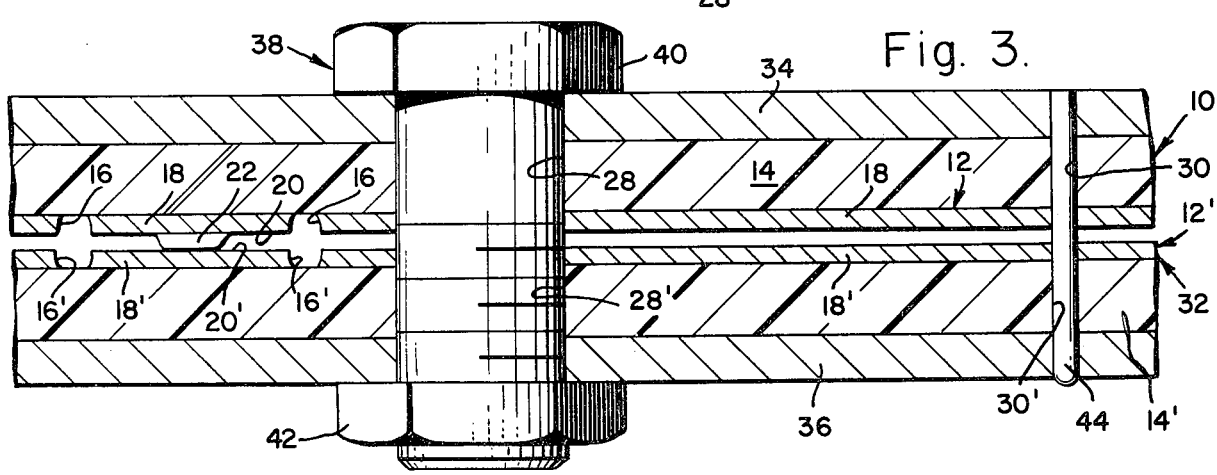
FIG. 3 is a view of the general means of securing two wafers together, as disclosed in copending patent application U.S. Ser. No. 636,514.

Specifically, as shown in FIG. 3, wafer 10 is secured to a cooperating wafer 32, both of which are of the same construction with the exception that wafer 32 is not provided with metallic buttons 22. In other respects, wafer 32 includes a dielectric material 14', and a conductive sheet 12' with grooves 16' to form conductor paths 18' terminating in contact pads 20'. Wafer 32 also is provided with a central hole 28' and an alignment hole 30'. Preferably, wafers 10 and 32 are sandwiched between a pair of pressure plates 34 and 36 and clamped together by fastening means 38, such as by screws, bolts 40 and nuts 42, and alignment pins 44.

Figure 4:
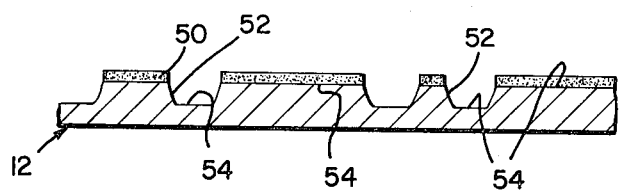
FIGS. 4–7 depict an illustrative means of forming the present invention.
Figure 5:
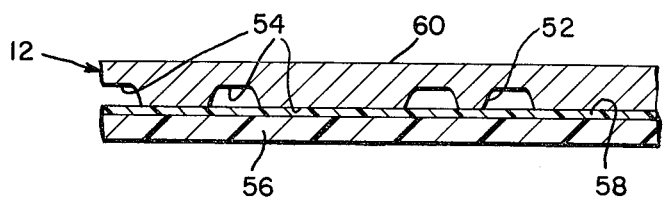
Figure 6:
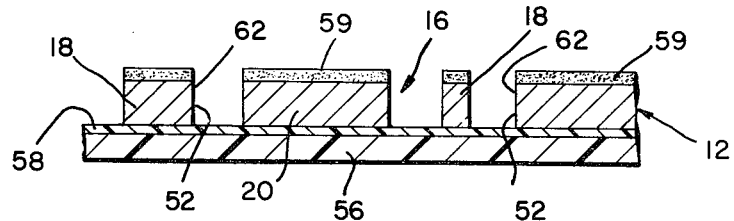

In the preparation of wafers 10 and 32, see FIGS. 1, 2 and 4–7, a sheet 12, such as of 7 mil thick beryllium copper, has a photoresist material 50 placed thereon. The photoresist material is configured so as to enable further delineation of the configuration of conductor paths 18 and contact pads 20. Sheet 12 is etched through approximately one-half its thickness to form half grooves 52 therein, as shown in FIG. 4. The processes utilized are conventional and are the same as those in etching of printed circuit boards. Photoresist mask 50 is then removed. As shown in FIG. 5 on surface 54 of sheet 12 which includes half grooves 52, is placed a dielectric material 56, such as polyimide, with an adhesive 58, such as pyralux, which may flow into or across etched grooves 52. Thereafter, as shown in FIG. 6, utilizing similar photoetching techniques and suitable art work configuration, including a photoresist mask 59, the other side 60 of sheet 12 is etched through to form half grooves 62, which extend to the previously made etched portion 52 to form therewith full grooves 16. Such etching, therefore, forms conductor paths 18 and contact pads 20. Mask 59 is removed.

Figure 7:
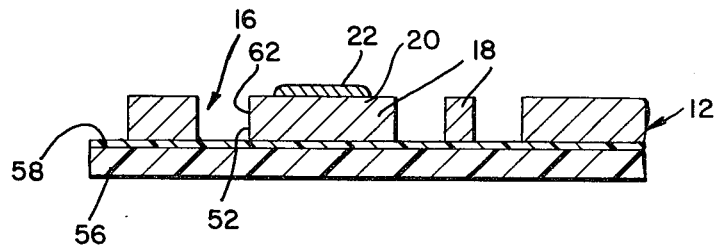

Then, as shown in FIG. 7, on only one of the wafers and by use of suitable artwork configuration, buttons 22 are formed on contact pads 20. Preferably, buttons 22 are formed by conventional photoresist and plating operations to form, at first, copper buttons of approximately 5–7 mils in diameter and 1–1.25 mils in height, which are plated onto the centers of contact pads 20. Thereafter, gold is plated onto the copper to a thickness of 100 to 250 millionths of a mil. The photoresist is then stripped off and a flash of gold is plated over both wafers.

Figure 8:
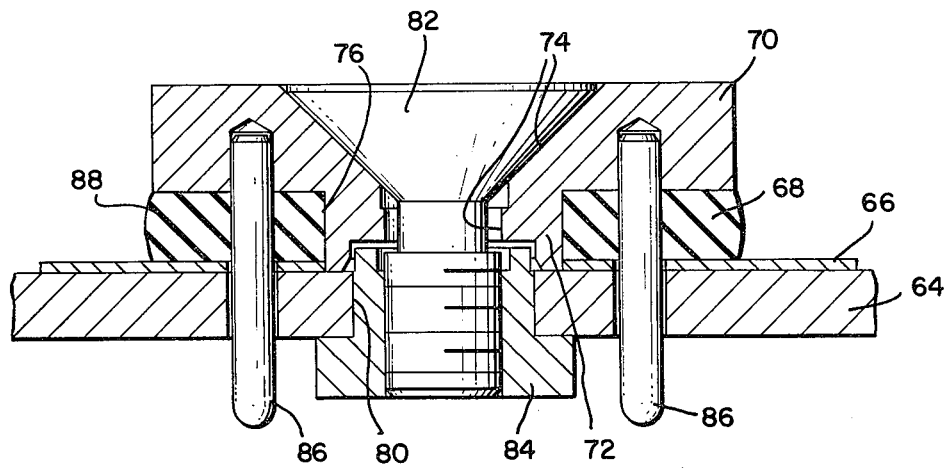
FIG. 8 shows an illustrative approach utilizing a compression pad placed between a pair of mating plates, in which one comprises a printed circuit board.
Figure 9:
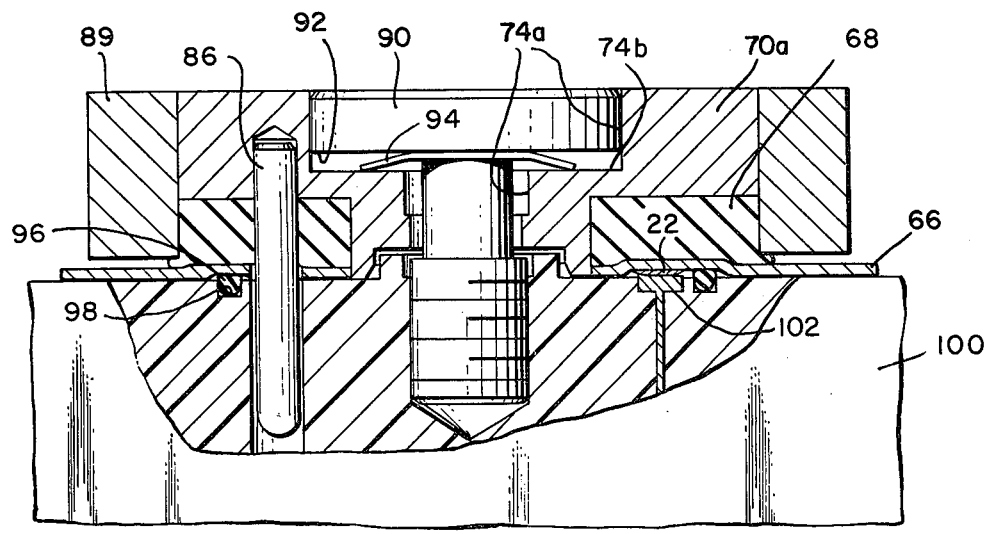
FIG. 9 illustrates alternative approaches utilizing a separate pressure spring and a compression pad placed between a pair of mating plates, in which one comprises a termination of an electronic component.

Each wafer is then attached to its flexible cable or conventional wire cable in any convenient manner, such as by surface lap soldering. Both wafers are then placed opposing each other, as shown in FIGS. 3, 8 and 9 such that the exposed copper surfaces face the other one. They are sandwiched between pressure plates or the like and clamped by means of screws through one plate and threaded into the other plate. The force exerted by the plates brings each button 22 on one wafer in contact with the flat surface contact pad 20' of the other wafer.

In copending application U.S. Pat. No. 4,125,310, the gold plated copper button is intended to flow to equalize the anomalies of the opposing surface, when a force of 1–2 lbs. per button is exerted. This force translates into 45,000–55,000 psi on the button surface. Since gold flows at 28,000 to 32,000 psi, a gas-tight seal is made between the two surfaces. At that pressure, the copper button goes into a plastic stage which performs as a spring, thereby maintaining a constant force. However, the copper may be compressed beyond its elastic limit and, therefore, can no longer act as a spring. Thus, repeatable mating and unmating is no longer possible.

Further, surface irregularities between the wafers may preclude contact between all buttons and pads.

Accordingly, in order to avoid the problems of deformation of buttons 22 beyond their plastic limit and wafer surface irregularities, an additional pressure distributing member is used, such as shown in the configurations of FIGS. 8 and 9. FIG. 8 also illustrates how the invention may be utilized with a printed circuit board, such as identified by indicium 64. In this embodiment, printed circuit board 64 is provided with a surface, such as shown in FIG. 1, with or without buttons 22. An etched circuit 66, such as shown in FIG. 1 with or without buttons 22, is placed above printed circuit board 64. It is to be understood, of course, that buttons 22 must be placed on one of board 64 or etched circuit 66. Placed above etched circuit 66 is a compression pad 68, such as of silicone rubber. A pressure plate 70 is placed above the compression pad and includes an extension 72 through which an opening 74 extends. Extension 72 is disposed to fit through openings 76 and 78 respectively in compression pad 68 and etched circuit 66. An opening 80 is provided in printed circuit 64 so that a screw 82 engages with sloped surface 74a of opening 74 and extends from pressure plate 70 and into engagement with a retaining nut 84. Nut 84 contacts one surface of printed circuit board 64 and extends through opening 80 thereof. A pair of alignment pins 86 are suitably secured to pressure plate 70 and extend through mating openings in compression pad 68, etched circuit 66, and printed circuit board 64 so as to provide increased and more exact alignment and orientation of mating contacts than that shown in FIGS. 1–3.

In the embodiment of FIG. 8, compression pad 68 it utilized both to obtain even distribution of pressures between etched circuit 66 and printed circuit board 64 as well as to obtain a gas-tight contact of the gold plated button 22 without deforming the buttons beyond their elastic limit. Because pressure pad 68 is unrestricted at its outer periphery 88, it may extrude somewhat beyond pressure plate 70 and, therefore, may act additionally to provide a spring relief.

However, when there are a sufficiently large number of contacts and buttons 22, the amount of pressure per contact may be insufficient to obtain sufficient sealing and even distribution of pressures and may, therefore, either be incapable of exerting the necessary contact pressure or, alternatively, may cause some buttons to be deformed beyond their plastic limit.

Therefore, as shown in FIG. 9, pad 68 is captured by enclosure ring 89, thereby limiting its compressibility. To provide the required resiliency, screw 82 of FIG. 8 may be configured as a screw 90 having a flat bottom surface 92 and an additional spring 94 may be placed between surface 92 of screw 90 and mating surface 74b of opening 74a of pressure plate 70a. In this configuration spring 94 may be of any convenient construction, although the preferred is as a Belleville washer. An O-ring 96 in groove 98 is used to provide environmental sealing along with resilient pad 68.

FIG. 9 also illustrates the use of the present invention for terminating electronic components 100, such as sensors, and for connecting contact pads 102 in such components to circuit 66.

It is to be understood that any of the individual parts of the configurations of FIGS. 8 and 9 may be exchanged or interchanged, as desired. For example, component 100 of FIG. 9 may be used in place of printed circuit board 64. Spring 94 and enclosure ring 89 may also be used with printed circuit board 64, and uncontained pad 68 of FIG. 8 may be used with component 96. Additionally, screws 82 and 90 may be extended out of component 100 for engagement by a nut with a spring washer under the nut. As a consequence, any desired combinations are obtainable.

It is to be further understood that, while a circular configuration of contacts has been illustrated, any other suitable configuration may be employed. For example, the contacts and compression pad may be formed in a linear configuration, e.g., for connection to an edge of a printed circuit board or to a rigid module which terminates a cable, whether or not flat.

It is to be further understood that, while a single metallic button is used for each contact pad 20, two or more metallic buttons may be formed on a single contact pad 20 is greater current carrying capacity is required.

Although the invention has been described with reference to particular embodiments thereof, it should be realized that various changes and modifications may be made therein without departing from the spirit and scope of the invention.

What is claimed is:

1. An electrical connector assembly comprising:
   a first member having a surface and a pattern of first solid contact pads on said surface and terminating first electrical conductors for maximizing the density of said first pads and for minimizing the surface area of said first-surface;
   a second member having a surface contiguously mateable with said first member surface and a pattern of second solid contact pads on said second surface and terminating second electrical conductors and having positions which mirror those of said pattern of first contact pads for enabling the greatest density of electrical contact between said electrical conductors of said first and second members in the smallest possible surface area;
   buttons of electrically conductive material terminating said first contact pads and extending from and above said surface of said first member at and for contact with said second contact pads;
   means electrically insulated from said first and second contacts and coupled to and securing said members together in the electrical contact in a pre-selected orientation of said patterns of said first and second contact pads; and
   first and second means electrically insulated from contact between said contact pads, said first means including means for evenly distributing any uneven forces between said members and said second means including means for ensuring complete contact between all said contact pads.

2. An electrical connector assembly as in claim 1 wherein said buttons comprise copper plated with gold.

3. An electrical connector assembly as in claim 1 wherein one of said members comprises a printed circuit board.

4. An electrical connector assembly as in claim 1 wherein one of said members comprises an electronic component.

5. An electrical connector assembly as in claim 1 wherein said first and second contact pads comprise beryllium copper of 7 mil thickness, and said buttons comprise copper of 5 to 7 mil diameter and 1 to 1.25 mil height on said contact pads and gold of 100 to 250 millionths of a mil on said copper.

6. An electrical connector assembly as in claim 1 further comprising means for respectively and separately encasing said first and second electrical conductors in dielectric insulation for defining first and second flexible, flat cables.

7. An electrical connector assembly as in claim 6 wherein said first and second members are respectively affixed to said first and second flexible, flat cables.

8. An electrical connector assembly as in claim 7 wherein said means for securing said members together include a pair of pressure plate means placed about said members for clamping said members together under pressure and wherein said first and second distributing and ensuring means respectively comprise a deformable material and resilient force exerting means placed between one of said plate means and one of said members.

9. An electrical connector assembly as in claim 8 wherein said means for securing said members together further include means for defining a nut and a bolt respectively extending together said plate means.

10. An electrical connector assembly as in claim 8 wherein said buttons extend from and above said first contact pads for defining the sole contact with said second contact pads, said buttons having plastic memory and said deformable material limiting the pressure exerted by said plate means on said members from exceeding the limit of the collective plastic memory of said buttons.

11. An electrical connector assembly as in claim 1 wherein said securing means comprises a pressure plate having an extension extending through at least a first of said members and means extending through the other of said members in engagement with said pressure plate for securing said members together.

12. An electrical connector assembly as in claim 11 wherein said first and second distributing and ensuring means respectively comprise a compression pad of elastomeric material sandwiched in environmental sealing between said pressure plate and said first member, and resilient force exerting means bearing against said pressure plate.

13. An electrical connector assembly as in claim 1 wherein each of said members comprise a wafer which includes a laminate of electrically conductive material and dielectric material adhered thereto, and means in said electrically conductive material for defining grooves therein and for defining a configuration of a plurality of conductor paths and said contact pads terminating said conductor paths in said electrically conductive material.

14. An electrical connector assembly as in claim 13 wherein said buttons are formed on and extend from said contact pads.

15. An electrical connector assembly as in claim 14 wherein said laminate of electrically conductive material and said dielectric material respectively consist of beryllium copper and polyimide, adhered together by pyralux, and said buttons consist of copper plated with gold.

16. An electrical connector assembly comprising:
   a first member having a surface and means on said member surface defining a pattern of first contact pads terminating first electrical conductors:
   a second member having a surface contiguously mateable with said first member surface, and means on said second member surface defining a pattern of second contact pads terminating second electrical conductors and having positions which mirror those of said pattern of first contact pads for enabling electrical contact between said electrical conductors of said first and second members;

a compression pad of elastomeric material on said first member and superimposed at least over said first contact pads for evenly distributing any uneven forces between mating ones of said contact pads; and a pressure plate having an extension through at least a first of said members and means extending through the other of said members in engagement with said pressure plate for securing said members together in the electrical contact and in a preselected orientation of said patterns of said first and second contact pads, said compression pad being sandwiched between said pressure plate and said first member, and said pressure plate including means for restricting compression of said compression pad and resilient means for exerting a resilient force on said pressure plate for ensuring complete contact between all said contact pads.

17. An electrical connector assembly as in claim 14 further including a bolt having a head in engagement with said resilient means for exerting, in combination therewith, the resilient force.

18. An electrical connector assembly comprising:
first and second members having respective means defining pairs of mateable contact pads;
means securing said members and said pairs of contact pads together in electrical contact;
compressible means sandwiched between said securing means and said first member and positioned at least in line with said mateable contact pads for evenly distributing any uneven forces therebetween;
means coupled to said securing means for restricting compression of said compressible means; and
resilient means coupled to said securing means and exerting a resilient force on said members for ensuring complete contact between all said contact pads.

19. An electrical connector assembly comprising:
at least first and second members having respective means defining at least pairs of mateable contact pads;
means securing said members and said pairs of contact pads together in electrical contact;
resilient means, comprising buttons of copper plated with gold having plastic memory, positioned between said pairs of mateable contact pads, said buttons extending from and above said contact pads of said first member for defining the sole contact with said contact pads of said second member; and
compressible means sandwiched between said securing means and said first member and positioned at least in line with said mateable contact pads for evenly distributing any uneven forces therebetween, the pressure exerted by said compressible means on said buttons preventing said buttons from exceeding their limit of plastic memory.

* * * * *